(12) United States Patent
Ling et al.

(10) Patent No.: US 10,361,670 B2
(45) Date of Patent: *Jul. 23, 2019

(54) GAIN PARTITIONING IN A RECEIVER

(71) Applicant: MaxLinear, Inc., Carlsbad, CA (US)

(72) Inventors: Curtis Ling, Carlsbad, CA (US);
Madhukar Reddy, Carlsbad, CA (US);
John Wetherell, Carlsbad, CA (US)

(73) Assignee: Maxlinear, Inc., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/720,637

(22) Filed: May 22, 2015

(65) Prior Publication Data
US 2017/0149399 A1 May 25, 2017

Related U.S. Application Data

(63) Continuation of application No. 14/044,817, filed on Oct. 2, 2013, now Pat. No. 9,059,672, which is a (Continued)

(51) Int. Cl.
*H03G 3/20* (2006.01)
*H03G 3/30* (2006.01)
(Continued)

(52) U.S. Cl.
CPC ............ *H03G 3/20* (2013.01); *H03G 3/3068* (2013.01); *H04B 1/16* (2013.01); *H04B 17/318* (2015.01)

(58) Field of Classification Search
CPC .......... H03G 3/00; H03G 3/001; H03G 3/002; H03G 3/20; H03G 3/30; H03G 3/301;
(Continued)

(56) References Cited

U.S. PATENT DOCUMENTS

| | | | | |
|---|---|---|---|---|
| 4,030,035 A | * | 6/1977 | Ienaka | H03G 3/3068 455/237.1 |
| 6,075,978 A | * | 6/2000 | Tsumura | H03G 3/3052 455/234.1 |

(Continued)

OTHER PUBLICATIONS

Jeffrey A. Weldon, et al. A 1.75-GHz Highly Integrated Narrow-Band CMOS Transmitter With Harmonic-Rejection Mixers, IEEE Journal of Solid-State Circuits, Dec. 2001, pp. 2003-2015, vol. 36, No. 12, Seattle, Washington.

*Primary Examiner* — Young T Tse
(74) *Attorney, Agent, or Firm* — McAndrews, Held & Malloy, Ltd.

(57) ABSTRACT

An automatic gain control loop disposed in a receiver is adapted to compensate for varying levels of out of band interference sources by adaptively controlling the gain distribution throughout the receive signal path. One or more intermediate received signal strength indicator (RSSI) detectors are used to determine a corresponding intermediate signal level. The output of each RSSI detector is coupled to an associated comparator that compares the intermediate RSSI value against a corresponding threshold. The take over point (TOP) for gain stages is adjusted based in part on the comparator output values. The TOP for each of a plurality of gain stages may be adjusted in discrete steps or continuously.

11 Claims, 5 Drawing Sheets

Related U.S. Application Data continuation of application No. 12/249,269, filed on Oct. 10, 2008, now Pat. No. 8,577,319.

(60) Provisional application No. 60/979,024, filed on Oct. 10, 2007.

(51) Int. Cl.
  *H04B 1/16* (2006.01)
  *H04B 17/318* (2015.01)

(58) Field of Classification Search
  CPC .. H03G 3/3052; H03G 3/3068; H03G 3/3073; H03G 3/3078; H04B 1/06; H04B 1/10; H04B 1/16; H04B 17/20; H04B 17/318; H04B 17/336
  USPC ....... 375/136, 147, 219, 259, 262, 316, 318, 375/324–326, 340, 344, 345; 455/226.2, 455/226.3, 234.1, 234.2, 235.1, 239.1, 455/240.1, 241.1, 245.2, 247.1, 250.1, 455/251.1, 253.1, 253.2
  See application file for complete search history.

(56) References Cited

U.S. PATENT DOCUMENTS

| | | |
|---|---|---|
| 6,906,498 B2 | 6/2005 | Breuch et al. |
| 6,992,855 B2 | 1/2006 | Ehrlich |
| 6,993,291 B2 * | 1/2006 | Parssinen ............ H03G 3/3068 341/139 |
| 7,095,454 B2 | 8/2006 | Waight et al. |
| 7,167,694 B2 | 1/2007 | Khoini-Poorfard et al. |
| 7,362,178 B2 | 4/2008 | Montemayor et al. |
| 7,373,125 B2 | 5/2008 | Godambe et al. |
| 7,421,259 B2 | 9/2008 | Gomez et al. |
| 8,285,240 B2 | 10/2012 | Seendripu et al. |
| 8,374,568 B2 | 2/2013 | Seendripu et al. |
| 8,374,569 B2 | 2/2013 | Seendripu et al. |
| 8,374,570 B2 | 2/2013 | Seendripu et al. |
| 8,526,898 B2 | 9/2013 | Reddy et al. |
| 8,577,319 B2 | 11/2013 | Ling et al. |
| 8,666,350 B2 | 3/2014 | Vauhkonen |
| 8,909,187 B2 | 12/2014 | Seendripu et al. |
| 9,059,672 B2 | 6/2015 | Ling et al. |
| 2004/0229561 A1 * | 11/2004 | Cowley ................ H03G 3/3068 455/3.01 |
| 2005/0040909 A1 | 2/2005 | Waight et al. |
| 2006/0079191 A1 * | 4/2006 | Parssinen ............ H03G 3/3068 455/226.1 |
| 2006/0111066 A1 * | 5/2006 | Thorpe ................ H03G 3/3068 455/232.1 |
| 2006/0141965 A1 * | 6/2006 | Hennig ................ H03G 3/3068 455/247.1 |
| 2007/0042742 A1 | 2/2007 | Kim et al. |
| 2007/0082639 A1 * | 4/2007 | Lindstrom ........... H04B 17/327 455/226.3 |
| 2008/0242249 A1 * | 10/2008 | Gomez ................ H03G 1/0088 455/234.1 |

* cited by examiner

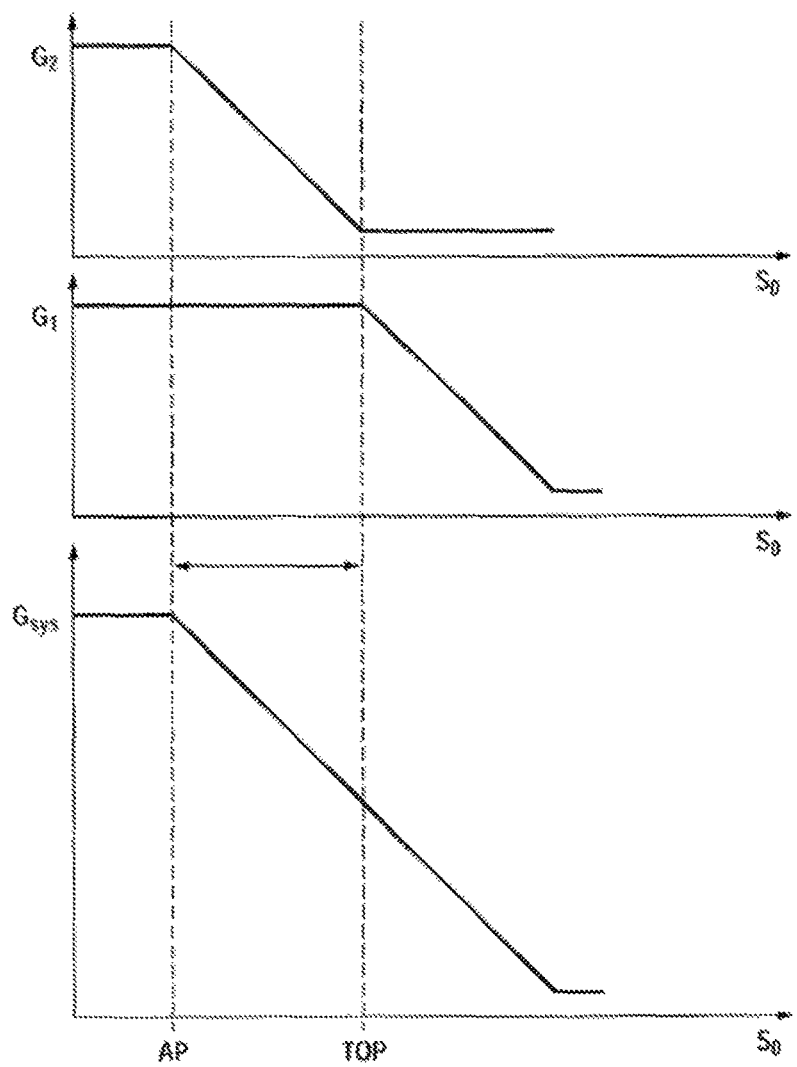
*FIG. 4*     (Prior Art)
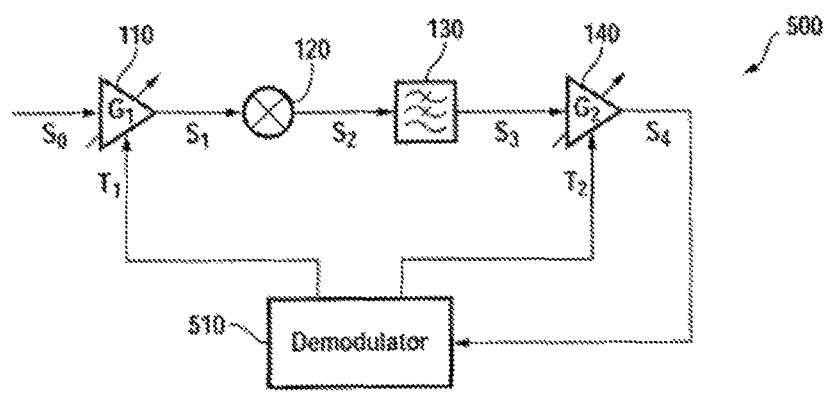
*FIG. 5*     (Prior Art)

GAIN PARTITIONING IN A RECEIVER

CROSS-REFERENCE TO RELATED APPLICATIONS

The present application claims priority to and is a continuation of U.S. patent application Ser. No. 14/044,817, now U.S. Pat. No. 9,059,672, filed Oct. 2, 2013, which is a continuation of U.S. patent application Ser. No. 12/249,269, now U.S. Pat. No. 8,577,319, filed Oct. 10, 2008, which application claims benefit under 35 USC 119(e) of U.S. Provisional Application No. 60/979,024, filed Oct. 10, 2007. The above identified applications are hereby incorporated herein by reference in their entirety.

BACKGROUND OF THE INVENTION

A receiver system typically consists of a series of stages consisting of pre-selectivity gain and mixing, frequency selectivity (i.e. a filter) and post-selectivity gain and mixing. Conventional receivers either set a total system gain with a predetermined partition between pre- and post selectivity gain, or rely on a separate controller or demodulator to independently adjust pre and post selectivity gains to achieve the linearity/noise tradeoff.

FIG. 1 is a simplified block diagram of a receiver 100, as known in the prior art. In receiver 100, amplifier 110 has a gain $G_1$ that provides pre-selectivity gain. Frequency converter 120, which may be a mixer, provides frequency conversion. Filter $D_1$ 130 is typically a bandpass filter adapted to filter out undesired signal. Amplifier 140 has a gain of G2 and provides post-selectivity gain. A local oscillator (not shown) is often used to provide an oscillating signal to frequency converter 120. Frequency converter 120, and filter 130 typically have finite linearity and thus it is desirable to limit the range of signals that are coupled to them.

FIG. 2A shows a spectrum of exemplary signals received by filter 130. The desired signal is shown as having the frequency Fd. The spectrum of the receives signals often includes undesired signal components (also referred to as blockers) shown as having frequencies Fb1 and Fb2 that interfere with the desired signal, causing non-linearity, distortion, etc. For example, the spacing and amplitude of the undesired signals Fb1 and Fb2 may result in a third order intermodulation distortion product at the output of amplifier 110. As such, it is not desirable to place too much gain before filter 130 which is adapted to attenuate the blocker signals, as shown in FIG. 2B. The reduction of the undesired signals enables amplifier 140 to amplify the desired frequencies in without substantially increasing the amplitudes of the undesired signals.

By reducing the gain G1 of amplifier 110, the linearity is improved. Reducing the gain of the first amplifier 110 also reduces the amplitude of signal S1. To keep the amplitude of signal S4 constant, gain G2 may be increased. The gain redistribution between amplifiers 110 and 140 reduces distortion but also results in degradation of the signal-to-noise (SNR) ratio. Therefore a tradeoff exists between increasing the gain G1 to improve signal to noise ratio, and degrading linearity performance of the system (increasing the distortion products in the signal) when blockers are present.

Gains $G_1$ and $G_2$ are typically selected such that the total gain $G_1*G_2$ is equal to a known value. In accordance with one conventional technique, for a given input signal level $S_0$, a predetermined gain partitioning of $G_1$ and $G_2$ is used. FIG. 3 is a block diagram of a conventional receiver 300 configured to achieve a predetermined gain partitioning of $G_1$ and $G_2$ using control signal $T_{sys}$. FIG. 4 shown plots of gains $G_1$, $G_2$ and $G_1*G_2(G_{sys})$ for a receiver having predetermined gain partitions.

In receiver 300, the gains of the first and second amplifiers 110 and 140, respectively, are controlled by gain controller 310 that controls the gains $G_1$ and $G_2$ in accordance with an algorithm that provides fixed gain partitioning using signal $T_{sys}$. FIG. 4 shows examples of the gain $G_1$ from amplifier 110, gain $G_2$ from amplifier 140 as well as the products of these two gains. The attack point (AP) represents the signal level at which total gain $G_{sys}$ begins to be fall. The take-over point (TOP) represents the signal level at which gain control is passed from signal $T_2$ to signal $T_1$. The TOP and AP values are typically predetermined and fixed. In a typical television system, a demodulator is used to generate control signals $T_1$ and $T_2$.

In accordance with another conventional technique, the output signal of the second amplification stage is used to determine the gain partitioning. FIG. 5 is a simplified block diagram of a receiver 500 having gain partitioning controlled by a demodulator 510. Demodulator 510 is configured to control the values of G1 and G2 depending on the presence and level of blockers. Demodulator 510 operates to control the partitioning of the gain between amplifiers 110 and 140 by sensing the output signal S4 of second amplifier 140. Demodulator 510 may be programmed to estimate whether blockers or other undesired signal components are 5 causing distortion in the desired signal. Demodulator 510 then repartitions the gain by adjusting signals T 1 and T 2.

BRIEF SUMMARY OF THE INVENTION

An automatic gain control loop disposed in a receiver is adapted to compensate for varying levels of out of band interference sources by adaptively controlling the gain distribution throughout the receive signal path. One or more intermediate received signal strength indicator (RSSI) detectors are used to determine a corresponding intermediate signal level. The output of each RSSI detector is coupled to an associated comparator that compares the intermediate RSSI value against a corresponding threshold. The take over point (TOP) for gain stages is adjusted based in part on the comparator output values. The TOP for each of a plurality of gain stages may be adjusted in discrete steps or continuously.

In accordance with the present invention, for a given receiver path gain defined, for example, by the product of the pre and post selectivity gains, the present invention provides a self-contained, compact apparatus and method for adjusting the partitioning between pre and post-selectivity gain to optimize the signal level entering the filter disposed in the receiver. The receiver is thus enabled to continuously trade off linearity against noise depending on the presence or absence of undesired signals (blockers) at other frequencies without relying on the intervention of an external controller or demodulator.

A receiver, in accordance with one embodiment of the present invention includes, in part, a first amplification stage, a frequency conversion module responsive to the first amplification stage, a filter responsive to the frequency conversion module, a second amplification stage responsive to the filter, and a controller adapted to vary a gain of each of the first and second amplification stages in response to an output signal of the first amplification stage and further in response to an overall gain selected for the receiver.

A receiver in accordance with another embodiment of the present invention includes, in part, a first amplification stage, a frequency conversion module responsive to the first amplification stage, a filter responsive to the frequency conversion module, and a second amplification stage responsive to the filter. The receiver is adapted to vary the gains of the first and second amplification stages in response to a first and second feedback signals.

In one embodiment, the first and second feedback signals are supplied by a controller responsive to signals representative of the output signals of the first and second amplification stages. In one embodiment, the controller is external to the receiver. In one embodiment, the controller is further responsive to the filter. In one embodiment, the receiver includes a third amplification stage. In such embodiments, the controller is further responsive to a third signal representative of the output signal of the third amplification stage.

A method of controlling the gain of a receiver, in accordance with one embodiment of the present invention, includes, in part, amplifying a received signal to generate a first signal using a first amplification stage, frequency converting the first signal, filtering the frequency converted signal, amplifying the filtered signal to generate a second signal using a second amplification stage, and varying a gain of each of the first and second amplification stage in response to an output signal of the first amplification stage and further in response to an overall gain selected for the receiver.

A method of controlling the gain of a receiver, in accordance with another embodiment of the present invention, includes, in part, amplifying a received signal to generate a first amplified signal using a first amplification stage, frequency converting the first amplified signal, filtering the frequency converted signal, amplifying the filtered signal to generate a second amplified signal using a second amplification stage, and varying a gain of each of the first and second amplification stage in response to first and second feedback signals.

In one embodiment, the method further includes, in part, applying signals representative of the first and second amplified signals to a controller, and generating the first and second feedback signals in response to the signals applied to the controller. In one embodiment, the controller is external to the receiver. In one embodiment, the method further includes applying a signal representative of the filtered signal to the controller. In one embodiment, the controller is further responsive to a third amplified signal present in the receiver.

BRIEF DESCRIPTION OF THE DRAWINGS

FIG. 4 is a simplified gain diagram of an embodiment of amplifier gains in a system having a predetermined gain partition.

FIG. 5 is a block diagram of a receiver, as known in the prior art.

DETAILED DESCRIPTION OF THE INVENTION

Figure 1:
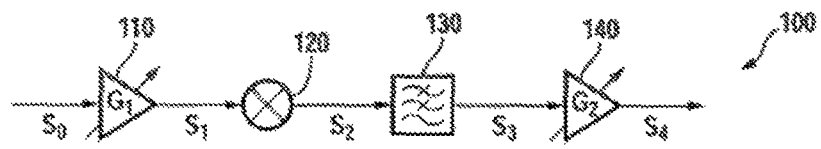
FIG. 1 is a simplified block diagram of a receiver, as known in the prior art.
Figure 2A:
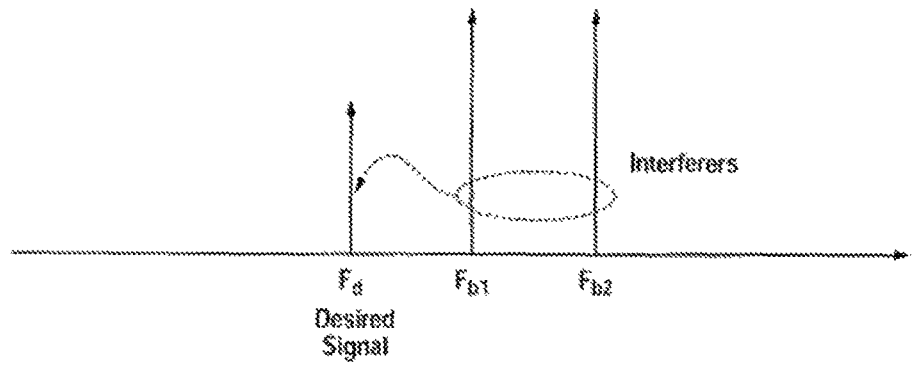
FIG. 2A shows a spectrum of exemplary signals received by a filter disposed in a wireless communication receiver.
Figure 2B:
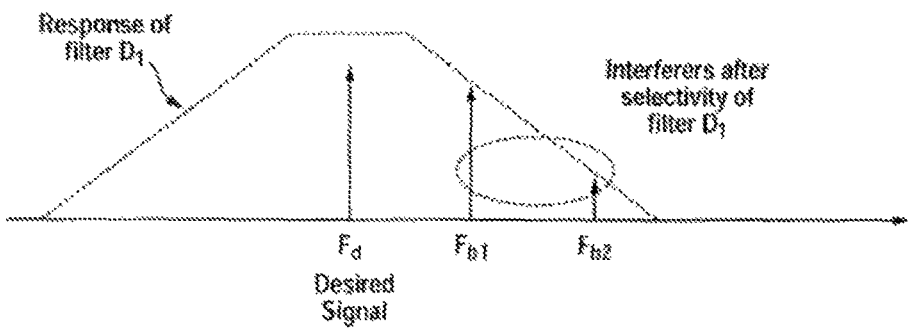
FIG. 2B shows the filtering characteristics of a filter adapted to attenuate the undesired signals shown in FIG. 2A.
Figure 3:
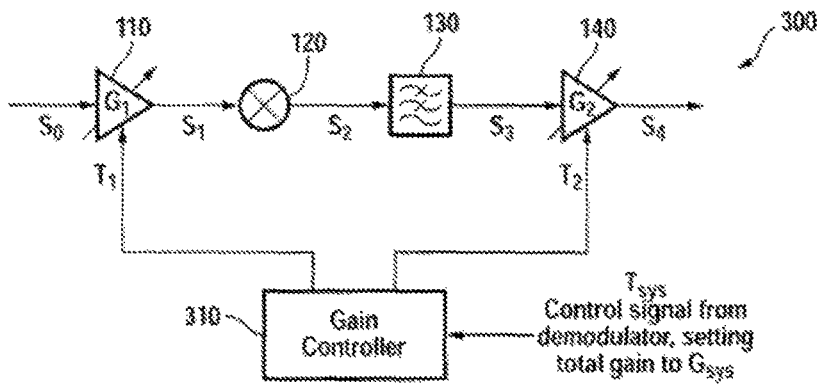
FIG. 3 is a simplified block diagram of a receiver, as known in the prior art.
Figure 6:
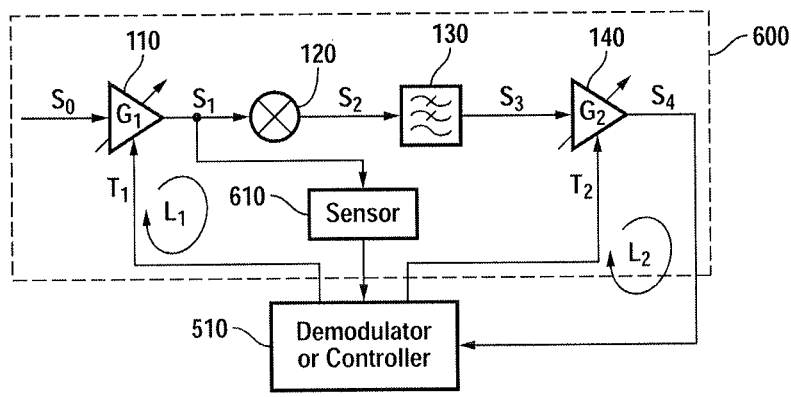
FIG. 6 is a simplified block diagram of a receiver, in accordance with one exemplary embodiment of the present invention.

FIG. 6 is a block diagram of a receiver 600, in accordance with one embodiment of the present invention. Receiver 600 is shown as including, in part, amplifiers 110, 140, frequency converter 120, filter 130 and sensor 610. A local oscillator (not shown) provides an oscillating signal to frequency converter 120. Frequency converter 120 may be a mixer, a multiplier, etc. Demodulator 510 may be external or internal to receiver 600. Sensor 610 sense signal S1 to determine the strength of the RF signal. Signal S1 so sensed is supplied to demodulator/controller 510. Also supplied to demodulator/controller 510 is signal S4 that is generated by amplifier 140. In response, demodulator/controller 510 generates signals T1 and T2 that are respectively applied to amplifiers 110 and 140 to control their gains. As see from FIG. 6, receiver 600 together with demodulator/controller 510 form a pair of control loops L1 and L2, which are independently controlled by the demodulator/controller 510. Loop L1 is used to control gain G1 via signal T1, and loop L2 is used to control gain G2 via signal T2. Demodulator/controller 510 may use any one of a number of different algorithms to vary the gains of amplifiers 110, and 140 using signals T1 and T2.

Figure 7:
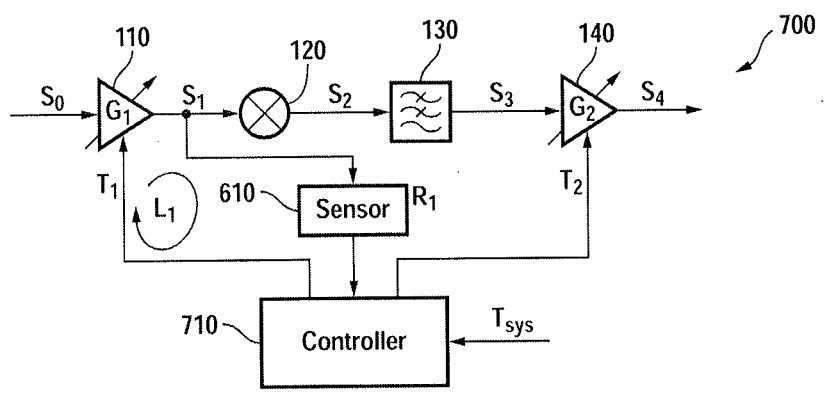
FIG. 7 is a simplified block diagram of a receiver, in accordance with another exemplary embodiment of the present invention.

FIG. 7 is a block diagram of a receiver 700, in accordance with another embodiment of the present invention. Receiver 700 is similar to receiver 600 except that in receiver 700 signal $T_{sys}$ applied to controller 710 includes information about the overall gain of the two amplification stages. Signal $T_{sys}$ may be supplied by, e.g., a demodulator. Accordingly in receiver 700, loop L1 is used to determine G1. Controller 710 knowing the overall gain signal represented by signal $T_{sys}$ sets the proper gain G2 using signal T2. The gain partitioning of receiver 700 automatically partitions the gains G1 and G2 to achieve a desired gain Gsys specified by controller 710 based on input from a single control line Tsys. Because only one control line Tsys is required in receiver 700, it is easy to implement. Furthermore, receiver 700 may be configured to adapt TOP to trade off linearity with signal to noise ratio depending on the level of blockers. Additionally, controller 710 may be exclusive of the demodulator and thus, controller 710 may be implemented on the same IC as the other elements of the receiver 700.

Figure 8A:
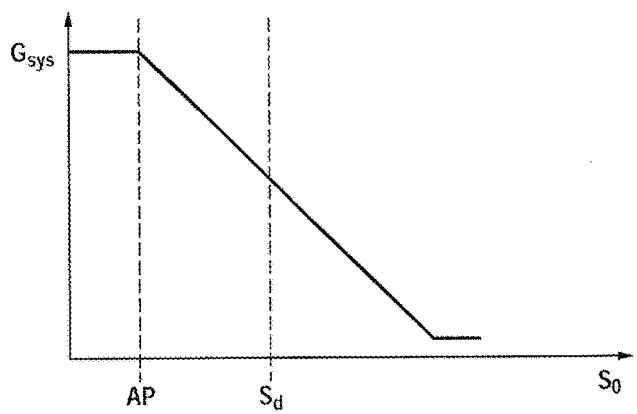
FIGS. 8A, 8B and 8C are examples of gain plots and gain partitioning for the receiver of FIG. 7.
Figure 8B:
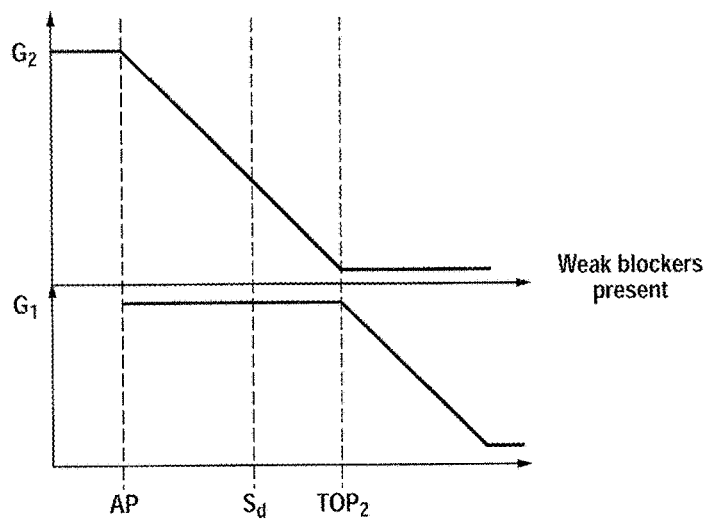
Figure 8C:
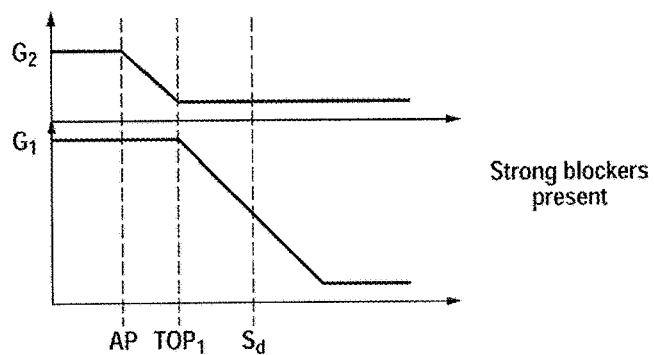

FIGS. 8A, 8B and 8C illustrates an example of gain curves and gain partitioning for the variable gain partitioning receiver of FIG. 7. FIG. 8A shows the characteristics of the overall gain $G_{sys}$ of receiver 700. When signal S1 exceeds a certain reference level, TOP is reduced until S1 equals the reference or falls within a certain range of the desired reference, for example, to $TOP_1$, as shown in FIG. 8C. When S1 falls below the reference, TOP is increased until S1 once again equals the reference, for example, to $TOP_2$, as shown in FIG. 8B.

Referring to FIGS. 7 and 8, controller 710 operates in the following manner. Assume that the desired channel signal $S_d$ is nearly constant, but blocker levels are fluctuating, causing total signal $S_1$ to change. When sensor 610 detects that the total signal $S_1$ has exceeded an optimal reference level, loop $L_1$ is used to reduce the TOP, effectively reducing $G_1$ through $T_1$. $G2$ is increased through $T_2$ to maintain a constant $G_{sys}$. Likewise, when sensor 610 detects that $S_1$ has dropped below the reference level, loop $L_1$ is used to increase the TOP, effectively increasing $G_1$ through $T_1$. $G2$ is decreased through $T_2$, again maintaining constant $G_{sys}$. The optimal reference level varies from application to application and can be programmed dynamically as the application changes. Hysteresis may be used to stabilize the circuit in a digital implementation.

The receiver 700 of FIG. 7 does not require an external controller or demodulator to optimize the gain partitioning, making the system very simple to interface with any demodulator, and any communication standard without the need for extensive software development.

A practical digital implementation is presented in conjunction with the method 900 illustrated below. It provides discrete steps in TOP control and receives a digital S1 signal. A circuit implementing the method 900, such as the controller 710 of FIG. 7, can compare the input S1 level to a reference level and increase or decrease a digital word controlling the TOP to compensate. The controller circuit can be clocked at a rate that can depend on the rate that the S1 signal is being updated.

Figure 9:
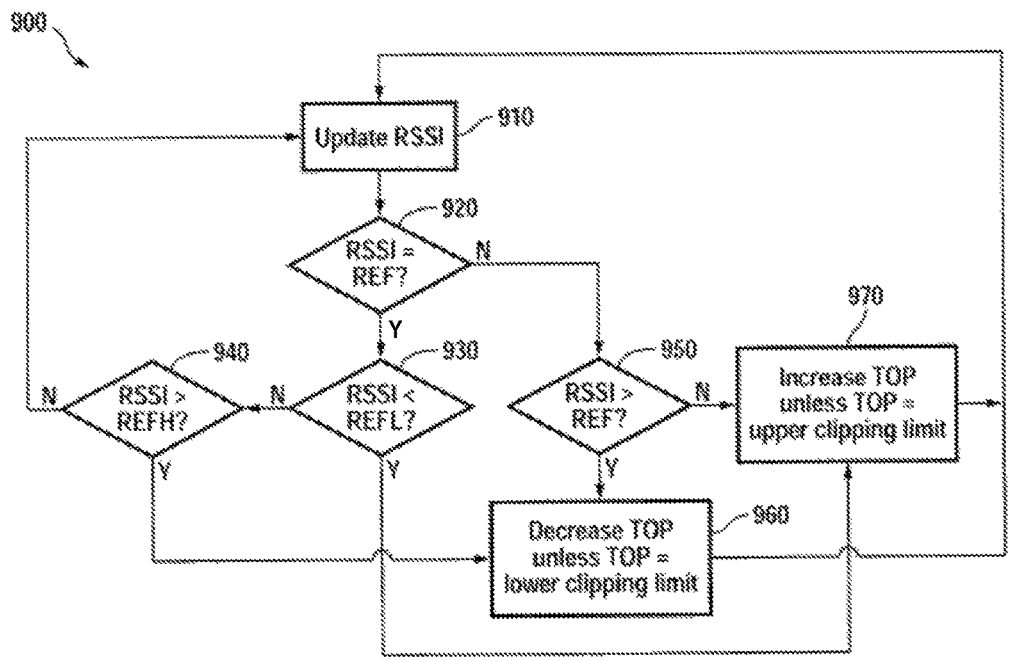
FIG. 9 is a flowchart of steps carried out to perform adaptive gain partitioning, in accordance with one embodiment of the present invention.

FIG. 9 is a flowchart 900 of steps carried out to perform adaptive gain partitioning, in accordance with one embodiment of the present invention. The process begins at step 910 when S1 (i.e., the output signal of the first amplification stage) value after the first gain stage is updated or upon the next iteration of the control loop if the S1 value is continuously updated or updated at a rate faster than the rate of the control loop. The controller receives the updated S1 value.

At step 920 a determination is made as to whether the S1 value is substantially the same as the predetermined reference level REF for the application that is presently active. If so, the controller proceeds to step 930 and determines if the S1 value is less than a predetermined low reference level REFL. If so, the controller proceeds to step 970 and increases the Take-Over-Point, up to a predetermined TOP limit.

If at step 930 the controller determines that S1 is not less than the low reference level REFL, the controller instead proceeds to step 940 where the controller determines if S1 is greater than the high reference level REFH. If not, the controller proceeds back to step 910 to await the next S1 update without making any changes to the TOP. If, at step 940, the controller determines that the RSSI is greater than the high reference level REFH, the controller proceeds to step 960 to decrease the TOP down to a predetermined lower limit.

Referring to step 920, if the controller determines that S1 is not substantially equal to the reference level, the controller proceeds to step 950 to determine if S1 is greater than the reference level. If not, the controller proceeds to step 970 to increase the TOP, but not to exceed the upper limit. If at step 950 the controller determines that S1 is greater than the reference level, the controller proceeds to step 960 to decrease the TOP but not smaller than a lower limit. The controller proceeds from either step 960 or step 970, that is, after adjusting the TOP, back to step 910 to await the next S1 update.

It is understood that additional signal strength monitoring loops may be added in the signal path in order to detect which portion of the signal path is experiencing saturation first. Such capability may be useful for allowing the receiver to distinguish between blockers which are far from the desired signal or close to the desired signal.

A close blocker is referred to as an N+/−1 blocker or adjacent channel blocker (that is, a blocker which is one channel above or below the desired channel N). Blockers further away in frequency are similarly labeled. In many receivers, an N+/−1 blocker may cause a portion of the signal path after mixing or filtering to limit receiver performance before the mixer saturates. A receiver is more susceptible to N+/−1 blockers because the (undesirable) third-order distortion products from these blockers are more severe at frequencies closer to the blockers. To remedy these problems, in accordance with one embodiment of the present invention, an adaptive gain partitioning receiver includes sensors in the signal path to allow the receiver to distinguish between close in blockers, such as N+/1, from N+/−2 and other blockers.

Figure 10:
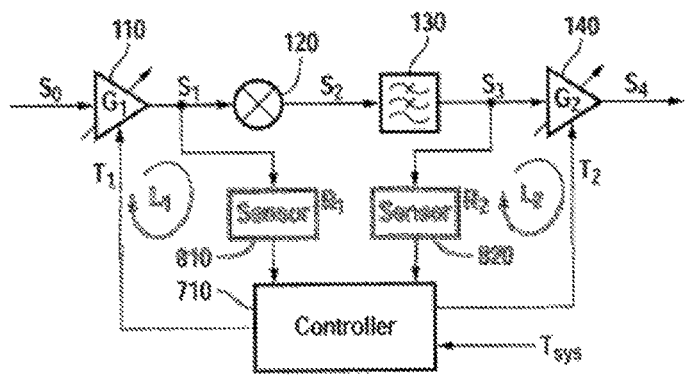
FIG. 10 is a block diagram of a receiver, in accordance with one exemplary embodiment of the present invention.

FIG. 10 is a block diagram of a receiver 1000 that includes a pair of signal strength sensors. 810 and 820. Receiver 1000 is thus similar to receiver 700 except that receiver 1000 senses strength of signals S1 and S3. The overall gain of the receiver is defined by signal $T_{sys}$ applied to controller 710. Receiver 1000 thus detects when the weakest link in the signal path is being strained, and adjusts the gain partition(s) to relieve the strain on that link. In the N+/1 blocker case, $S_3$ will reach a level where its distortion from filter $D_1$ and other baseband circuits will begin to affect the signal before the signal $S_1$ becomes the dominant source of distortion. The controller 710 can decide to reduce the gain $G_1$ and compensate by increasing gain $G_2$, thereby keeping $S_3$ below a predetermined threshold. Other filters and gain control mechanisms can be introduced in the signal path and controlled in a similar manner.

The above embodiments of the present invention are illustrative and not limiting. Various alternatives and equivalents are possible. The invention is not limited by the number of subbands disposed in the diversity receiver. The invention is not limited by the type of integrated circuit in which the present disclosure may be disposed. Nor is the disclosure limited to any specific type of process technology, e.g., CMOS, Bipolar, or BICMOS that may be used to manufacture the present disclosure. Other additions, subtractions or modifications are obvious in view of the present disclosure and are intended to fall within the scope of the appended claims.

What is claimed is:

1. A receiver comprising:
   a first amplification stage;
   a frequency conversion circuit responsive to the first amplification stage;
   a filter responsive to the frequency conversion circuit;
   a second amplification stage responsive to said filter; and
   a controller adapted to vary a gain of each of the first amplification stage and the second amplification stage in response to an output signal of the first amplification stage and further in response to an input signal of the second amplification stage, wherein the output signal of the first amplification stage is received by the controller and is operably coupled to the frequency conversion circuit, and wherein the controller is operable to reduce the gain of the first amplification stage and increase the gain of the second amplification stage to maintain the input signal of the second amplification stage below a threshold.

2. A receiver comprising:
a first amplification stage;
a frequency conversion circuit responsive to the first amplification stage;
a filter responsive to the frequency conversion circuit; and
a second amplification stage responsive to said filter;
said receiver varying gains of the first and second amplification stages in response to a first control signal and a second control signal, wherein an output signal of the first amplification stage is used to determine said first control signal and said second control signal, and wherein a controller is operable to reduce the gain of the first amplification stage and increase the gain of the second amplification stage to maintain an input signal of the second amplification stage below a threshold.

3. The receiver of claim 2, wherein said first control signal and said second control signal are supplied by the controller responsive to an overall gain selected for the first and second amplification stages.

4. The receiver of claim 3, wherein said controller is external to the first and second amplification stages.

5. The receiver of claim 3, wherein said controller is responsive to the filter.

6. A method of controlling a gain of a receiver, the method comprising:
amplifying a received signal to generate a first signal using a first amplification stage;
frequency converting, via a frequency conversion circuit, the first signal;
filtering the frequency converted signal;
amplifying the filtered signal to generate a second signal using a second amplification stage; and
varying a gain of each of the first amplification stage and the second amplification stage in response to an output signal of the first amplification stage and further in response to an overall gain selected for the first and second amplification stages, wherein the output signal of the first amplification stage is received by a controller and the frequency conversion circuit, and wherein the gain of the first amplification stage is reduced and the gain of the second amplification stage is increased to maintain an input signal of the second amplification stage below a threshold.

7. A method of controlling a gain of a receiver, the method comprising:
amplifying a received signal to generate a first amplified signal using a first amplification stage;
frequency converting, via a frequency conversion circuit, the first amplified signal;
filtering the frequency converted signal;
amplifying the filtered signal to generate a second amplified signal using a second amplification stage; and
varying a gain of each of the first amplification stage and the second amplification stage in response to a first control signal and a second control signal, wherein an output signal of the first amplification stage is used to determine said first control signal and said second control signal, and wherein the gain of the first amplification stage is reduced and the gain of the second amplification stage is increased thereby maintaining the filtered signal below a threshold.

8. The method of claim 7, further comprising:
applying a signal representative of the first amplified signal to a controller;
applying an overall gain signal to the controller; and
generating said first control signal and said second control signal in response to the signal and the overall gain signal applied to the controller.

9. The method of claim 8, wherein said controller is external to the first and second amplification stages.

10. The method of claim 8, further comprising:
applying a signal representative of the filtered signal to the controller; and
generating said first control signal and said second control signal in response to the signal representative of the first amplified signal, the overall gain signal, and the signal representative of the filtered signal applied to the controller.

11. The method of claim 8, wherein said controller is operable to control a gain partitioning according to the first control signal.

* * * * *